United States Patent
Nakahara

(10) Patent No.: US 8,847,469 B2
(45) Date of Patent: Sep. 30, 2014

(54) COMPOSITE SUBSTRATE AND METHOD FOR MANUFACTURING THE COMPOSITE SUBSTRATE

(75) Inventor: Toshinao Nakahara, Nagoya (JP)

(73) Assignee: NGK Insulators, Ltd., Aichi-prefecture (JP)

( * ) Notice: Subject to any disclaimer, the term of this patent is extended or adjusted under 35 U.S.C. 154(b) by 462 days.

(21) Appl. No.: 13/331,125

(22) Filed: Dec. 20, 2011

(65) Prior Publication Data
US 2012/0161585 A1 Jun. 28, 2012

(30) Foreign Application Priority Data
Dec. 22, 2010 (JP) ................... 2010-285760

(51) Int. Cl.
*H01L 41/053* (2006.01)
*H01L 41/22* (2013.01)
*H04R 17/00* (2006.01)

(52) U.S. Cl.
USPC ........... 310/348; 310/328; 310/368; 29/25.35

(58) Field of Classification Search
USPC .......... 310/311, 328, 348, 367, 368; 29/25.35
See application file for complete search history.

(56) References Cited

U.S. PATENT DOCUMENTS

| | | | | |
|---|---|---|---|---|
| 5,666,706 | A * | 9/1997 | Tomita et al. ................ | 29/25.35 |
| 6,538,296 | B1 * | 3/2003 | Wan .............................. | 257/415 |
| 7,743,503 | B2 * | 6/2010 | Okabe et al. ................ | 29/890.1 |
| 2006/0114297 | A1 * | 6/2006 | Bertelsen et al. ............... | 347/85 |
| 2010/0109486 | A1 * | 5/2010 | Polyakov et al. ............. | 310/365 |
| 2010/0156241 | A1 | 6/2010 | Suzuki et al. | |

FOREIGN PATENT DOCUMENTS

| | | |
|---|---|---|
| DE | 102005055870 A1 | 5/2007 |
| JP | 2-274009 A | 11/1990 |
| JP | 2006-319679 A | 11/2006 |

OTHER PUBLICATIONS

European Search Report for European Patent App. No. 11194768.5 (Mar. 7, 2014).

* cited by examiner

*Primary Examiner* — Thomas Dougherty
(74) *Attorney, Agent, or Firm* — Cermak Nakajima McGowan LLP; Tomoko Nakajima

(57) ABSTRACT

In a composite substrate, a back surface of a piezoelectric substrate and a front surface of a support substrate are bonded to each other with an adhesive layer. The adhesive layer includes a swelling portion at an outer peripheral area thereof, and the piezoelectric substrate is bonded to the support substrate in an area excluding the swelling portion 16a. Accordingly, air bubbles do not easily enter between the swelling portion of the adhesive layer and the piezoelectric substrate, and separations caused by the air bubbles can be prevented. As a result, the support substrate and the piezoelectric substrate can be reliably bonded to each other with the adhesive layer including the swelling portion in the outer peripheral area thereof.

5 Claims, 6 Drawing Sheets

COMPOSITE SUBSTRATE AND METHOD FOR MANUFACTURING THE COMPOSITE SUBSTRATE

This application claims priority under 35 U.S.C. §119 to Japanese Patent Application No. 2010-285760, filed Dec. 22, 2010, the entirety of which is incorporated by reference herein.

BACKGROUND OF INVENTION

1. Field of Invention

The present invention relates to a composite substrate and a method for manufacturing the composite substrate.

2. Description of the Related Art

Acoustic wave devices manufactured by arranging electrodes on a composite substrate including a support substrate and a piezoelectric substrate that are bonded together have been known. The acoustic wave devices are used as, for example, band-pass filters in communication devices, such as mobile phones. Patent Document 1, for example, discloses a composite substrate including a piezoelectric substrate formed of lithium niobate, lithium tantalate, or the like and a support substrate formed of silicon, quartz, or the like. According to Patent Document 1, the piezoelectric substrate and the support substrate are bonded together by applying an ultraviolet-curable adhesive to the support substrate by spin coating.

CITATION LIST

Patent Document 1: JP 2006-319679 A

SUMMARY OF INVENTION

When the adhesive is applied to the support substrate by spin coating, the adhesive forms a swelling portion in an outer peripheral area thereof, owing to a centrifugal force applied in the spin coating process. When the support substrate and the piezoelectric substrate are bonded to each other with the adhesive having the swelling portion, adhesion failure may occur at the swelling portion. As a result, the support substrate and the piezoelectric substrate may become separated from each other. Such a separation probably occurs because of air bubbles that enter between the swelling portion of the adhesive layer and the piezoelectric substrate.

The present invention has been made in view of the above-described problem, and the main object of the present invention is to reliably bond a support substrate and a piezoelectric substrate to each other with an adhesive layer including a swelling portion in an outer peripheral area thereof.

To achieve the above-described object, the following means is employed in the present invention.

A composite substrate according to the present invention includes a piezoelectric substrate, a support substrate, and an adhesive layer with which the piezoelectric substrate and the support substrate are bonded to each other. The adhesive layer includes a flat portion and a swelling portion formed in an outer peripheral area of the flat portion. The piezoelectric substrate includes a first surface that is bonded to the flat portion of the adhesive layer and a second surface at the side opposite to the front surface, and is bonded to the support substrate in an area excluding the swelling portion.

Although the adhesive layer in the composite substrate includes the swelling portion in the outer peripheral area thereof, the piezoelectric substrate is bonded to the support substrate in the area excluding the swelling portion. Accordingly, air bubbles do not easily enter between the swelling portion of the adhesive layer and the piezoelectric substrate, and separations caused by the air bubbles can be prevented. As a result, the support substrate and the piezoelectric substrate can be reliably bonded to each other with the adhesive layer including the swelling portion in the outer peripheral area thereof.

In the composite substrate according to the present invention, an outer peripheral edge of the first surface may be in contact with a boundary between the swelling portion and the flat portion of the adhesive layer. In such a case, the edge portion of the first surface as the bonding area between the piezoelectric substrate and the adhesive layer is protected by the swelling portion of the adhesive layer. Accordingly, when the composite substrate is subjected to a cleaning process, the piezoelectric substrate may be prevented from being separated from the adhesive layer by acid or alkaline solution used in the cleaning process.

In the composite substrate according to the present invention, the piezoelectric substrate may have a bulging portion that is formed such that the first surface of the piezoelectric substrate is inside the second surface of the piezoelectric substrate when the first surface is projected in a perpendicular direction onto the second surface. In such a case, cracks can be prevented from being formed in the piezoelectric substrate when, for example, the composite substrate is subjected to a heating process. The reason for this is believed to be as follows. That is, since the piezoelectric substrate includes the bulging portion, the second surface of the piezoelectric substrate that is not bonded to the support substrate is larger than the first surface of the piezoelectric substrate that is bonded to the support substrate with the adhesive layer. Thus, the volume of the second surface, which has more freedom than the first surface, is relatively large. The bulging portion probably serves to reduce the stress applied to the edge portion when the support substrate and the piezoelectric substrate expand or contract in the heating process. In this case, an angle between the first surface of the piezoelectric substrate and an outer peripheral surface of the piezoelectric substrate may be obtuse.

A method for manufacturing a composite substrate according to the present invention includes (a) a step of preparing a piezoelectric substrate; (b) a step of applying an adhesive to a surface of a support substrate by spin coating; and (c) a step of forming a composite substrate by bonding the support substrate and the piezoelectric substrate to each other with the adhesive. The piezoelectric substrate prepared in step (a) includes a first surface and is shaped such that, in bonding in step (c), the first surface of the piezoelectric substrate is capable of being bonded to a flat portion of the adhesive layer and the piezoelectric substrate is capable of being bonded to the support substrate in an area excluding a swelling portion of the adhesive layer that is formed in an outer peripheral area of the flat portion, the flat portion and the swelling portion being formed when the adhesive is applied to the support substrate by spin coating in step (b). In step (c), the bonding is performed so that the first surface is bonded to the flat surface of the adhesive layer and that the piezoelectric substrate is bonded to the support substrate in the area excluding the swelling portion According to the method for manufacturing the composite substrate of the present invention, although the swelling portion is formed in the outer peripheral area of the adhesive when the adhesive is applied to the support substrate by spin coating in step (b), the piezoelectric substrate is bonded to the support substrate in the area excluding the swelling portion in step (c). Accordingly, air bubbles do not easily enter between the swelling portion of the adhesive layer and the piezoelectric substrate, and separations caused by the air bubbles can be prevented in the composite substrate manufactured by the above-described manufacturing method. As a result, a composite substrate may be manufactured in which the support substrate and the piezoelectric substrate are reliably bonded to each other with the adhesive layer including the swelling portion in the outer peripheral area thereof.

DESCRIPTION OF PREFERRED EMBODIMENTS

Figure 1:
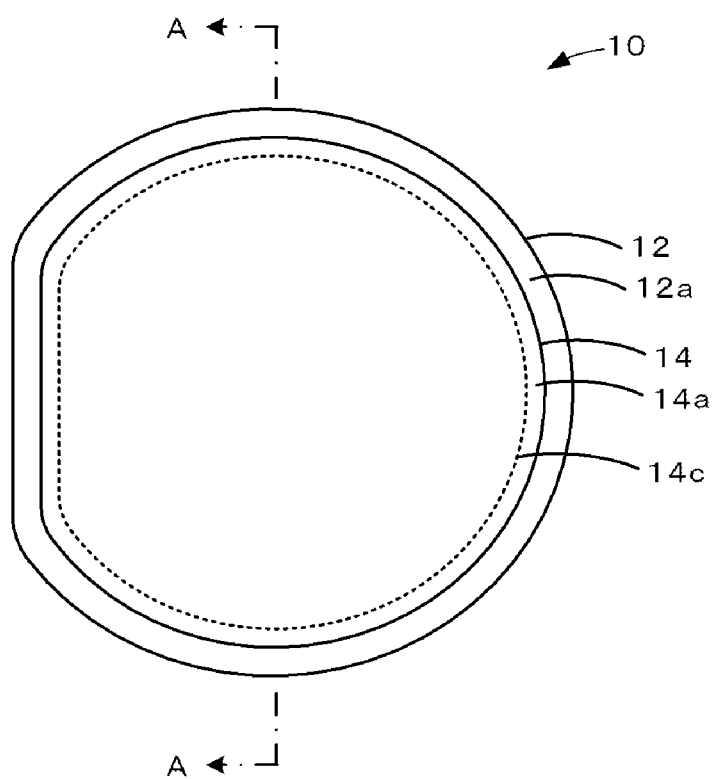
FIG. 1 is a plan view of a composite substrate 10.
Figure 2:
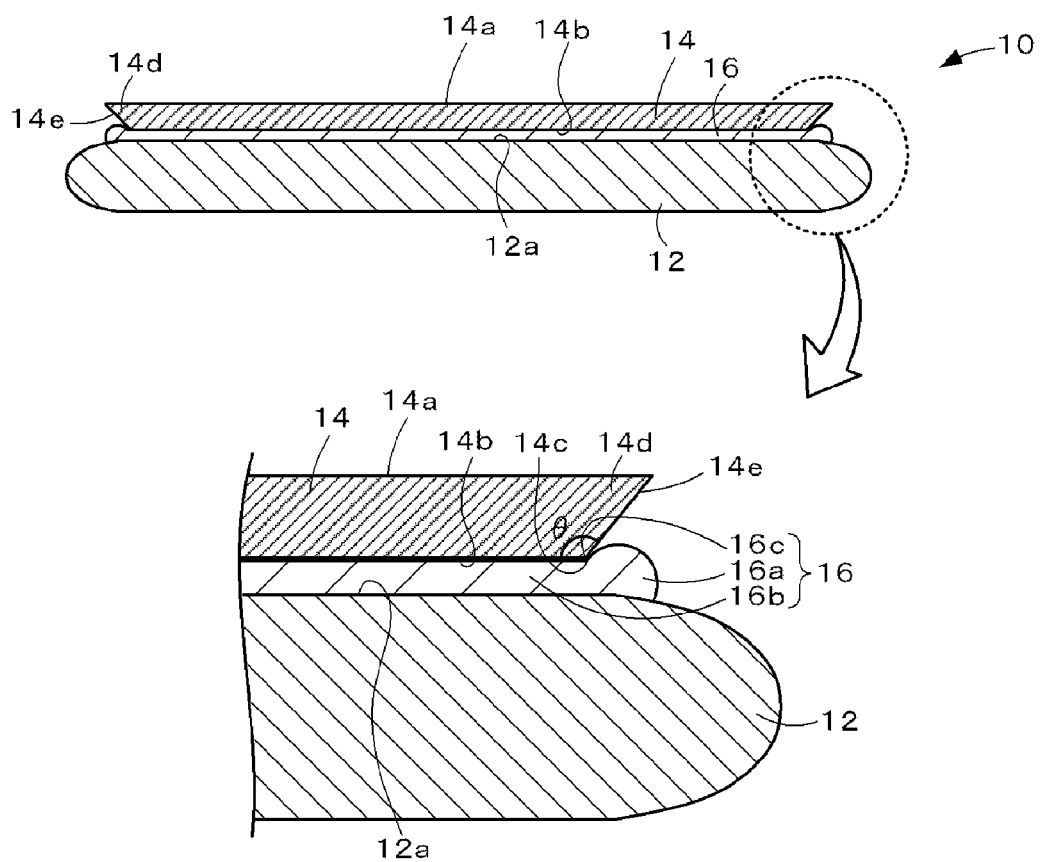
FIG. 2 is a sectional view of FIG. 1 taken along line A-A.

An embodiment of the present invention will now be described with reference to the drawings. FIG. 1 is a plan view of a composite substrate 10 according to an embodiment of the present invention. FIG. 2 is a sectional view of FIG. 1 taken along line A-A. The composite substrate 10 according to the present invention is formed by bonding a plurality of substrates together. The composite substrate 10 includes a support substrate 12, a piezoelectric substrate 14, and an adhesive layer 16 with which a front surface 12a of the support substrate 12 and a back surface 14b of the piezoelectric substrate 14 are bonded to each other. The composite substrate 10 has a circular shape with a single flat portion. This flat portion is called an orientation flat (OF) portion, and is used to detect the position and orientation of a wafer when, for example, the wafer is subjected to various operations in a process of manufacturing a surface acoustic wave device.

The support substrate 12 supports the piezoelectric substrate 14 that is bonded to the front surface 12a, which is the top surface of the support substrate 12, with the adhesive layer 16. The material of the support substrate 12 may be, for example, silicon, sapphire, aluminum nitride, alumina, borosilicate glass, silica glass, lithium tantalate, lithium niobate, lithium niobate-lithium tantalate solid-solution single crystal, lithium borate, langasite, or quartz. The support substrate 12 has a coefficient of thermal expansion that is lower than that of the piezoelectric substrate 14. The difference in coefficient of thermal expansion between the support substrate 12 and the piezoelectric substrate 14 may be 5 ppm/° C. or more. When the coefficient of thermal expansion of the piezoelectric substrate 14 is in the range of 13 to 20 ppm/° C., the coefficient of thermal expansion of the support substrate 12 is preferably in the range of 2 to 7 ppm/° C. The size of the support substrate 12 is not particularly limited. For example, the support substrate 12 may have a diameter in the range of 50 to 150 mm and a thickness in the range of 100 to 500 µm. The front surface 12a is a bonding surface of the support substrate 12 that is bonded to the adhesive layer 16. The term "front surface" is used merely for convenience, and the front surface may instead be referred to as a "back surface".

The adhesive layer 16 is provided to bond the front surface 12a of the support substrate 12 and the back surface 14b of the piezoelectric substrate 14 to each other. The adhesive layer 16 includes a swelling portion 16a in an outer peripheral area thereof. The swelling portion 16a is formed when, for example, an adhesive is applied to the front surface 12a of the support substrate 12 by spin coating to form the adhesive layer 16. A portion of the adhesive layer 16 other than the swelling portion 16a is formed as a flat portion 16b. Namely, the adhesive layer 16 includes the swelling portion 16a and the flat portion 16b. Although the material of the adhesive layer 16 is not particularly limited, a heat-resistant organic adhesive is preferably used. For example, an epoxy adhesive or an acrylic adhesive may be used.

The piezoelectric substrate 14 is a substrate capable of propagating acoustic waves (in particular, surface acoustic waves). The material of the piezoelectric substrate 14 may be, for example, lithium tantalate, lithium niobate, lithium niobate-lithium tantalate solid-solution single crystal, lithium borate, langasite, or quartz. The back surface 14b (a first surface) of the piezoelectric substrate 14 is in contact with the flat portion 16b of the adhesive layer 16, but is not in contact with the swelling portion 16a. In other words, the piezoelectric substrate 14 is bonded to the support substrate 12 with the adhesive layer 16 in an area excluding the swelling portion 16a of the adhesive layer 16. An outer peripheral edge 14c of the back surface 14b of the piezoelectric substrate is in contact with a boundary 16c between the swelling portion 16a and the flat portion 16b of the adhesive layer 16. The piezoelectric substrate 14 includes a bulging portion 14d that is formed such that the back surface 14b is inside a front surface 14a (a second surface) when the back surface 14b is projected onto the front surface 14a in a direction perpendicular to the front surface 14a. In other words, an outer peripheral surface 14e of the piezoelectric substrate 14 is formed such that the circumference thereof increases toward the front surface 14a from the back surface 14b. The outer peripheral surface 14e is formed such that an angle θ between the back surface 14b and the outer peripheral surface 14e is more than 90° and less than 180°, that is, such that the angle θ is obtuse. The angle θ is preferably in the range of 110° or more and 170° or less. The back surface 14b is a bonding surface of the piezoelectric substrate 14 that is bonded to the adhesive layer 16, and the front surface 14a is a surface at the side opposite to the bonding surface (back surface 14b). The terms "front surface" and "back surface" are used merely for convenience. The bonding surface (the first surface) of the piezoelectric substrate 14 that is bonded to the adhesive layer 16 may instead be referred to as a "front surface", and the surface (the second surface) at the side opposite to the bonding surface may instead be referred to as a "back surface".

Multiple acoustic wave devices are formed on the composite substrate 10 by photolithography, and then the individual acoustic wave devices are separated from each other by a dicing process. The acoustic wave devices may be, for example, surface acoustic wave devices, Lamb wave devices, or film bulk acoustic resonators (FBAR). For example, a surface acoustic wave device is formed by arranging an input interdigital transducer (IDT) electrode (also referred to as a comb-shaped electrode or an interdigital transducer) for exciting a surface acoustic wave and an output IDT electrode that receives the surface acoustic wave on the front surface 14a of the piezoelectric substrate 14. When a high-frequency signal is applied to the input IDT electrode, an electric field is generated between the electrodes and a surface acoustic wave is excited and propagated along the piezoelectric substrate. The output IDT electrode, which is located at a position toward which the surface acoustic wave is propagated, outputs an electric signal based on the propagated surface acoustic wave. As described above, the support substrate 12 has a coefficient of thermal expansion that is lower than that of the piezoelectric substrate 14. Therefore, in a surface acoustic wave device that is formed by using the composite substrate 10, variation in the size of the piezoelectric substrate 14 caused by temperature variation can be suppressed by the support substrate 12. As a result, variation in frequency characteristics of the surface acoustic wave device caused by temperature variation can be suppressed.

Next, a method for manufacturing the composite substrate 10 will be described with reference to FIGS. 3A to 3D. FIGS. 3A to 3D are schematic sectional views illustrating a manufacturing process of the composite substrate 10. The method for manufacturing the composite substrate 10 includes (a) a step of preparing a piezoelectric substrate 24 having an outer peripheral surface that has been ground; (b) a step of applying an adhesive by spin coating to the front surface 12a of the support substrate 12 that has been prepared; and (c) a step of forming a composite substrate 20 by bonding the front surface 12a of the support substrate 12 and a back surface 24b of the piezoelectric substrate 24 to each other with the adhesive.

Figure 3A:
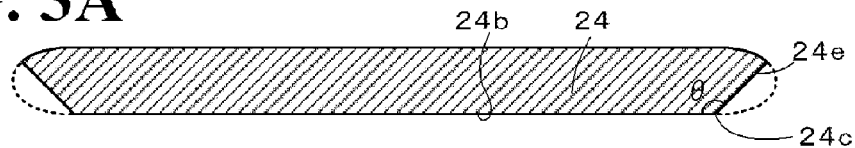
FIGS. 3A to 3D are schematic sectional views illustrating a manufacturing process of the composite substrate 10.

In step (a), the piezoelectric substrate 24, which is used to form the piezoelectric substrate 14, is prepared (FIG. 3A). The piezoelectric substrate 24 may be made of one of the above-mentioned materials. The size of the piezoelectric substrate 24 is not particularly limited. For example, the piezoelectric substrate 24 may have a diameter in the range of 50 to 150 mm and a thickness in the range of 250 to 500 μm. An outer peripheral portion (portion shown by broken lines in FIG. 3A) of the piezoelectric substrate 24 is ground in advance so that the angle between the back surface 24b and an outer peripheral surface 24e after the grinding process is set to θ. The value of the angle θ will be described below. Instead of performing the grinding process, a substrate that is initially formed in the shape shown by the solid lines in FIG. 3A may be prepared as the piezoelectric substrate 24.

Figure 3B:
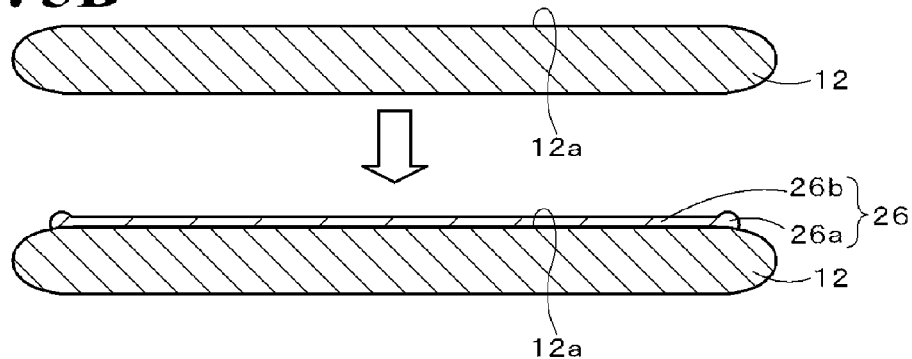

In step (b), the support substrate 12 is prepared and an adhesive 26 used to form the adhesive layer 16 is applied to the front surface 12a of the support substrate 12 (see FIG. 3B). The support substrate 12 may be made of one of the above-mentioned materials and have the above-described size. The adhesive 26 may be one of the above-mentioned materials of the adhesive layer 16. When the adhesive 26 is applied to the support substrate 12 by spin coating, the adhesive 26 forms a swelling portion 26a in an outer peripheral area thereof and a flat portion 26b in an area other than the swelling portion 26a.

Figure 3C:
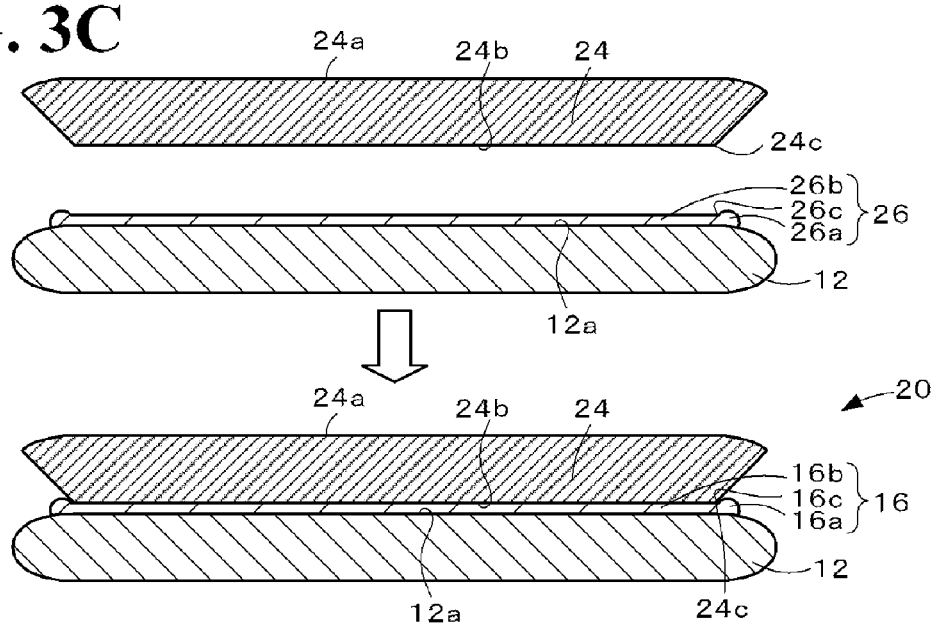

In step (c), the composite substrate 20 is formed by bonding the front surface 12a of the support substrate 12 and the back surface 24b of the piezoelectric substrate 24 to each other with the adhesive 26 and solidifying the adhesive 26 (FIG. 3C). The adhesive 26 is formed into the adhesive layer 16 by the solidifying process. The piezoelectric substrate 24 prepared in step (a) is shaped such that, in step (c), the piezoelectric substrate 24 is bonded with the adhesive 26 in an area excluding the swelling portion 26a and an outer peripheral edge 24c of the back surface 24b comes into contact with a boundary 26c between the swelling portion 26a and the flat portion 26b of the adhesive 26. Therefore, in the composite substrate 20 formed by the boning process, the back surface 24b of the piezoelectric substrate 24 is not bonded to the swelling portion 26a. The angle θ of the piezoelectric substrate 24 prepared in step (a) is set in advance such that the piezoelectric substrate 24 can be bonded in the above-described manner. The size of the swelling portion 26a is determined by the diameter of the support substrate 12, the material of the adhesive 26, and conditions, such as a rotation speed, under which spin coating is performed in step (b). Accordingly, the angle θ may be determined in advance on the basis of the above-mentioned conditions so that the piezoelectric substrate 24 can be bonded in an area excluding the swelling portion 26a.

Figure 3D:
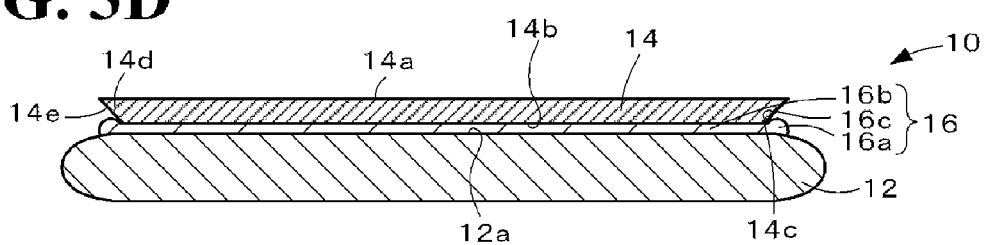

After the composite substrate 20 is formed, in step (d), a front surface 24a (see FIG. 3C) of the piezoelectric substrate 24 is ground such that the thickness of the piezoelectric substrate 24 is reduced and the front surface 24a is mirror polished (FIG. 3D). As a result, the piezoelectric substrate 14 illustrated in FIG. 1 is formed from the piezoelectric substrate 24 and the composite substrate 10 is obtained.

When the piezoelectric substrate 24 prepared in the above-described step (a) is not shaped such that the piezoelectric substrate 24 can be bonded in an area excluding the swelling portion 26a in step (c) (for example, when the process of grinding the portion shown by the broken lines in FIG. 3A is not performed), there is a risk that adhesion failure will occur in the bonding process in step (c). This is probably because air bubbles will enter between the swelling portion 16a of the adhesive layer 16 and the piezoelectric substrate 24 in the bonding process. In contrast, according to the method for manufacturing the composite substrate 10 of the present embodiment, the piezoelectric substrate 24 is shaped such that the piezoelectric substrate 24 can be bonded in an area excluding the swelling portion 26a in step (c). Therefore, the adhesion failure can be prevented.

In the above-described composite substrate 10 according to the present embodiment, although the swelling portion 16a is formed in the outer peripheral area of the adhesive layer 16, the piezoelectric substrate 14 is bonded to the support substrate 12 in the area excluding the swelling portion 16a. Therefore, air bubbles do not easily enter between the swelling portion 16a of the adhesive layer 16 and the piezoelectric substrate 14. Accordingly, the support substrate 12 and the piezoelectric substrate 14 may be reliably bonded to each other.

The outer peripheral edge 14c of the back surface 14b of the piezoelectric substrate 14 is in contact with the boundary 16c between the swelling portion 16a and the flat portion 16b. Therefore, the edge portion of the bonding area between the piezoelectric substrate 14 and the adhesive layer 16 is protected by the swelling portion 16a. Accordingly, when the composite substrate 10 is subjected to a cleaning process, the piezoelectric substrate 14 may be prevented from being separated from the adhesive layer 16 by acid or alkaline solution used in the cleaning process.

The piezoelectric substrate 14 includes the bulging portion 14d that is formed such that the back surface 14b is inside the front surface 14a when the back surface 14b is projected onto the front surface 14a in a direction perpendicular to the front surface 14a. Therefore, cracks can be prevented from being formed in the piezoelectric substrate 14 when, for example, the composite substrate 10 is subjected to a heating process. The reason for this is believed to be as follows. That is, since the piezoelectric substrate 14 includes the bulging portion 14d, the front surface 14a of the piezoelectric substrate 14, which is not bonded to the support substrate 12, is larger than the back surface 14b of the piezoelectric substrate 14, which is bonded to the support substrate 12 with the adhesive layer 16. Thus, the volume of the front surface 14a, which has more freedom than the back surface 14b, is relatively large. The bulging portion 14d probably serves to reduce the stress applied to the edge portion when the support substrate 12 and the piezoelectric substrate 14 expand or contract in the heating process.

The present invention is not limited to the above-described embodiment, and various modifications are, of course, possible within the technical scope of the present invention.

Figure 4:
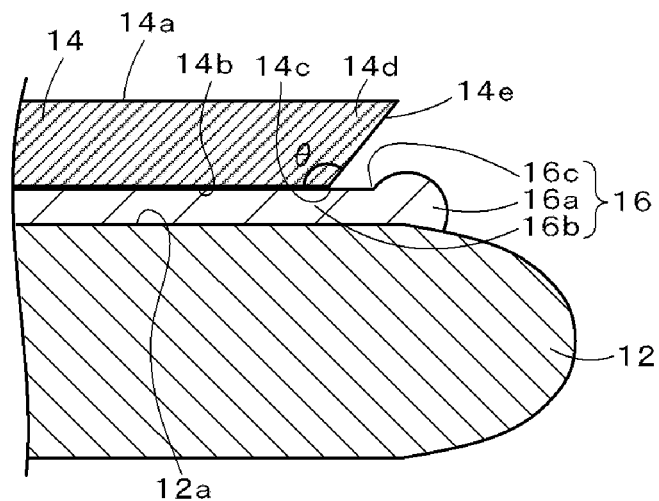
FIG. 4 is a schematic sectional view of a composite substrate according to a modification.

For example, in the above-described embodiment, the boundary 16c of the adhesive layer 16 is in contact with the outer peripheral edge 14c of the back surface 14b of the piezoelectric substrate 14. However, it is not necessary that the boundary 16c be in contact with the outer peripheral edge 14c as long as the piezoelectric substrate 14 is bonded to the support substrate 12 in an area excluding the swelling portion 16a. FIG. 4 is a schematic sectional view of a composite substrate according to this modification. Also in this case, the piezoelectric substrate 14 is bonded to the support substrate 12 in an area excluding the swelling portion 16a, so that the support substrate 12 and the piezoelectric substrate 14 may be reliably bonded to each other.

Figure 5:
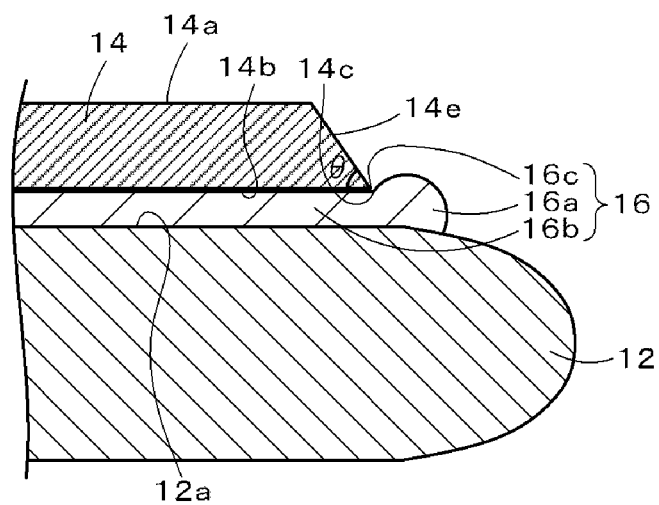
FIG. 5 is a schematic sectional view of a composite substrate according to another modification.

Although the angle θ is obtuse in the above-described embodiment, the angle θ may instead be acute. FIG. 5 is a schematic sectional view of a composite substrate according to this modification. Also in this case, the piezoelectric substrate 14 is bonded to the support substrate 12 in an area excluding the swelling portion 16a, and the outer peripheral edge 14c of the back surface 14b is in contact with the boundary 16c. Therefore, the above-described effects can be obtained.

Figure 6:
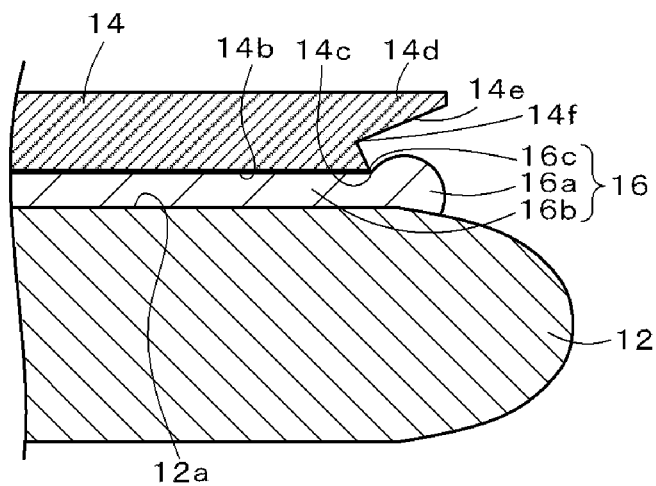
FIG. 6 is a schematic sectional view of a composite substrate according to another modification.
Figure 7:
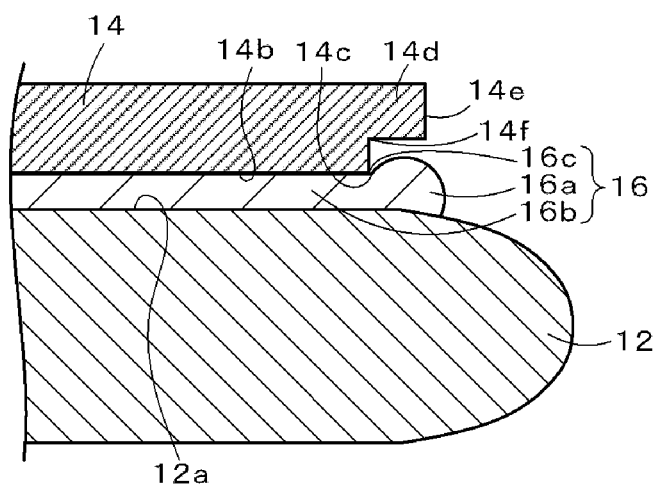
FIG. 7 is a schematic sectional view of a composite substrate according to another modification.

In the above-described embodiment, the outer peripheral surface 14e has a linear shape in cross section. However, the outer peripheral surface 14e may instead have, for example, a curved shape in cross section. In addition, as illustrated in FIGS. 6 and 7, a constricted part 14f may be formed in the outer peripheral surface 14e in cross section. Also in this case, the piezoelectric substrate 14 is bonded to the support substrate 12 in an area excluding the swelling portion 16a, and the outer peripheral edge 14c of the back surface 14b is in contact with the boundary 16c. In addition, since the bulging portion 14d is formed, the above-described effects can be obtained.

EXAMPLES

Example 1

Figure 8:
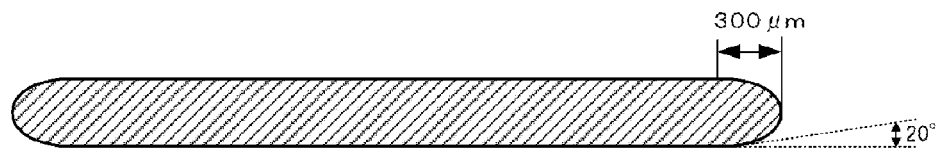
FIG. 8 is a sectional view of a piezoelectric substrate 14 before grinding that is used in step (a)

As Example 1, the composite substrate 10 illustrated in FIGS. 1 and 2 was manufactured by the manufacturing method illustrated in FIG. 3. First, in step (a), a lithium tantalate substrate (LT substrate) including an orientation flat (OF) portion was prepared as the piezoelectric substrate 24. The LT substrate had a diameter of 4 inches and a thickness of 250 μm, and the outer peripheral surface thereof was ground as illustrated in FIG. 3A. The LT substrate was a 46° rotated Y-cut X-propagation LT substrate in which X is the propagation direction of the surface acoustic wave (SAW). As illustrated in FIG. 8, a corner of the LT substrate before the grinding process was chamfered or rounded from a position 300 μm inward from the outer peripheral surface of the LT substrate, and the angle of chamfer at this position was 20°. In the grinding process, the LT substrate was retained on a rotating table by vacuum attraction, and a grinding wheel that rotates was brought into contact with the outer peripheral surface of the LT substrate that also rotates. As a result of the grinding process, the LT substrate was formed into a shape in which the angle θ illustrated in FIG. 3A was 120° and the diameter φ of the back surface 14b of the piezoelectric substrate 24 was 96 mm. The values of the angle θ and the diameter φ were determined in accordance with the result of a preliminary experiment performed to check the diameter of the flat portion 26b of the adhesive 26 and the height of the swelling portion 26a of the adhesive 26.

Next, in step (b), a silicon substrate including an OF portion and having a diameter of 4 inches and a thickness of 230 μm was prepared as the support substrate 12. An epoxy adhesive was used as the adhesive 26 and applied by spin coating to the front surface 12a of the support substrate 12. As a result, a layer of the adhesive 26 having a diameter of 100 mm was formed. The diameter of the flat portion 26b of the adhesive 26 was 98 mm, and a peripheral portion of the adhesive 26 that surrounds the flat portion 26b was formed as the swelling portion 26a. The height of the swelling portion was 0.5 μm.

Next, in step (c), the front surface 12a of the support substrate 12 to which the adhesive 26 was applied and the back surface 24b of the piezoelectric substrate 24 were bonded to each other with the adhesive 26. The adhesive 26 was solidified by being irradiated with ultraviolet rays of 2,000 mJ through the piezoelectric substrate 24. Thus, the composite substrate 20 was formed. As described above, the piezoelectric substrate 24 was bonded to the support substrate 12 so that the back surface 24b was bonded to the flat portion 26b and bonded in an area excluding the swelling portion 26a. The thickness of the adhesive layer 16 formed by solidifying the adhesive was 1 μm.

In step (d), the LT substrate was polished with a polishing machine until the thickness of the LT substrate was reduced to 40 μm. In this example, a polishing machine that performs mirror-polishing after reducing the thickness was used. Specifically, in the process of reducing the thickness, the composite substrate 20 was placed between a polishing plate and a pressure plate. The pressure plate was rotated while slurry including polishing particles was supplied to between the composite substrate 20 and the polishing plate and the composite substrate 20 was pressed against the polishing plate surface with the pressure plate. Next, in the process of mirror polishing, the polishing plate was changed to a polishing plate having a pad bonded thereto and the polishing particles were changed to those having a higher grain size number. Then, the pressure plate was rotated and revolved, so that the surface of the piezoelectric substrate 24 was mirror polished. First, the LT substrate in the composite substrate 20 was pressed against the polishing plate surface and was continuously polished for 60 minutes at a rotation speed of 100 rpm. Next, the polishing plate was changed to a polishing plate having a pad bonded thereto and the polishing particles were changed to those having a higher grain size number. Then, mirror polishing was continuously performed for 60 minutes at a rotation speed of 100 rpm and a revolution speed of 100 rpm while the pressure at which the composite substrate 20 was pressed against the polishing plate surface was set to 0.2 MPa. Thus, the composite substrate 10 illustrated in FIGS. 1 and 2 was manufactured.

Example 2

As Example 2, the composite substrate 10 was manufactured by a process similar to that of Example 1 except a 42° rotated Y-cut X-propagation LT substrate, in which X is the propagation direction of the surface acoustic wave, was prepared as the piezoelectric substrate 24 in step (a).

Example 3

As Example 3, the composite substrate 10 was manufactured by a process similar to that of Example 1 except a 64° rotated Y-cut X-propagation lithium niobate substrate (LN substrate), in which X is the propagation direction of the surface acoustic wave, was prepared as the piezoelectric substrate 24 in step (a).

Example 4

As Example 4, the composite substrate 10 was manufactured by a process similar to that of Example 1 except the piezoelectric substrate 24 prepared in step (a) was ground into a shape in which the angle θ illustrated in FIG. 3A was 95° and the diameter φ of the back surface 24b of the piezoelectric substrate 24 was 98 mm. Also in the composite substrate 10 of Example 4, similar to Example 1, the piezoelectric substrate 14 was bonded to the support substrate 12 in an area excluding the swelling portion 16a of the adhesive layer 16. In addition, the outer peripheral edge 14c of the back surface 14b of the piezoelectric substrate 14 was in contact with the boundary 16c between the swelling portion 16a and the flat portion 16b of the adhesive layer 16.

Example 5

As Example 5, the composite substrate 10 was manufactured by a process similar to that of Example 1 except the piezoelectric substrate 24 prepared in step (a) was ground into a shape in which the angle θ illustrated in FIG. 3A was 150° and the diameter φ of the back surface 24b of the piezoelectric substrate 24 was 98 mm. Also in the composite substrate 10 of Example 5, similar to Example 1, the piezoelectric substrate 14 was bonded to the support substrate 12 in an area excluding the swelling portion 16a of the adhesive layer 16. In addition, the outer peripheral edge 14c of the back surface 14b of the piezoelectric substrate 14 was in contact with the boundary 16c between the swelling portion 16a and the flat portion 16b of the adhesive layer 16.

Comparative Example 1

Figure 9A:
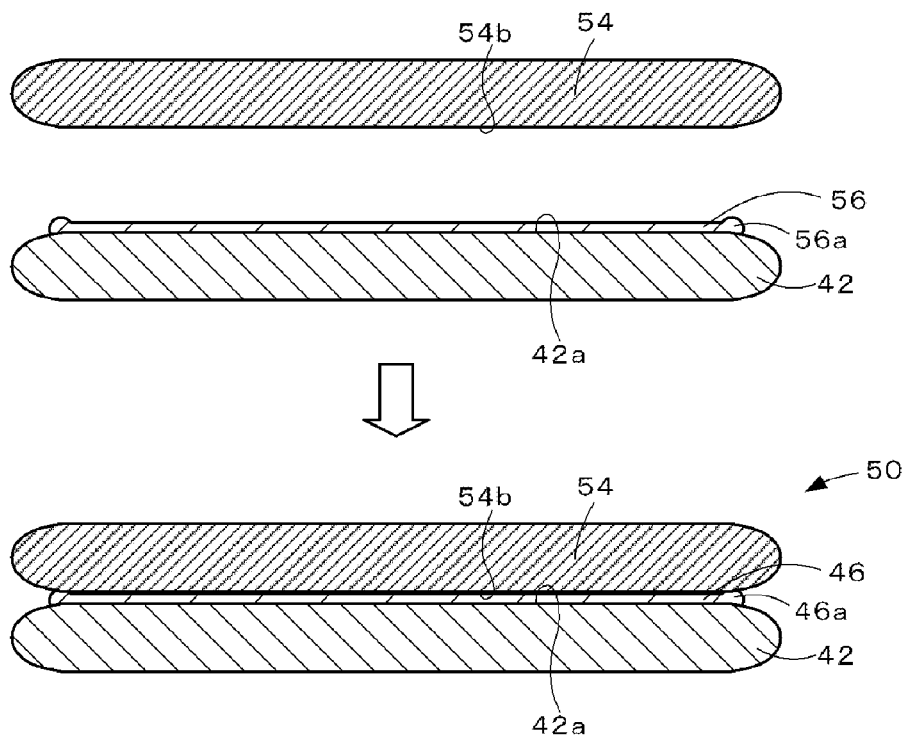
FIGS. 9A and 9B are schematic sectional views illustrating a manufacturing process of a composite substrate 40.

As Comparative Example 1, a composite substrate 40 was manufactured by a process similar to that of Example 1 except the outer peripheral portion of an LT substrate prepared in step (a) was not ground and the LT substrate illustrated in FIG. 8 was used without performing the grinding process. Specifically, as illustrated in FIG. 9(a), a piezoelectric substrate 54 that is identical to the LT substrate illustrated in FIG. 8 and a support substrate 42 that is identical to that used in Example 1 were prepared. Then, similar to Example 1, an epoxy adhesive was used as an adhesive 56 and applied by spin coating to a front surface 42a of the support substrate 42. Then, the front surface 42a of the support substrate 42 to which the adhesive 56 was applied and a back surface 54b of the piezoelectric substrate 54 were bonded to each other with the adhesive 56. Since the outer peripheral portion of the piezoelectric substrate 54 was not ground, the piezoelectric substrate 54 was bonded to the support substrate 42 in an area including the swelling portion 56a of the adhesive 56. Accordingly, the back surface 54b of the piezoelectric substrate 54 was bonded to the swelling portion 56a. Then, the adhesive 56 was solidified by being irradiated with ultraviolet rays of 2,000 mJ through the piezoelectric substrate 54. Thus, a composite substrate 50 was formed. The thickness of an adhesive layer 46 formed by solidifying the adhesive was 1 μm.

Figure 9B:
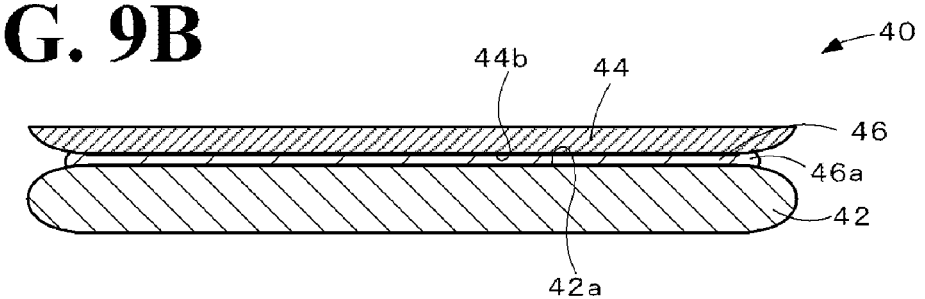

Next, similar to Example 1, the composite substrate 50 was polished with a polishing machine until the thickness of the LT substrate was reduced to 40 μm, as illustrated in FIG. 9(b). Thus, the composite substrate 40 was formed.

Evaluation Test

The states of adhesion between the LT substrates (LN substrate in Example 3) and the silicon substrates in the composite substrates 10 according to Examples 1 to 5 and the composite substrate 40 according to Comparative Example 1 were compared with each other. Specifically, the front surfaces of the LT substrates (LN substrate in Example 3) in the composite substrates 10 and 40 were observed with a differential interference microscope. As a result, in the composite substrate 40, an interference pattern was observed in an outer peripheral area (area directly above the swelling portion 46a) of the front surface of the piezoelectric substrate 44. This is probably because air bubbles were present between the swelling portion 46a and the back surface 44b of the piezoelectric substrate 44. In contrast, no interference pattern was observed in the composite substrates 10 of Examples 1 to 5. As a result, it has been found that the support substrate 12 and the piezoelectric substrate 14 can be reliably bonded to each other by bonding the piezoelectric substrate 14 to the support substrate 12 in an area excluding the swelling portion 16a of the adhesive layer 16. In addition, it has been found from the results of Examples 1 to 5 that the effect of suppressing the entrance of air bubbles between the swelling portion 16a of the adhesive layer 16 and the piezoelectric substrate 14 does not change even when the cut angle, the material, or the angle θ of the piezoelectric substrate 14 is changed.

The present application claims priority from Japanese Patent Application No. 2010-285760, filed on Dec. 22, 2010, the entire contents of which are incorporated herein by reference.

What is claimed is:

1. A composite substrate comprising:
   a piezoelectric substrate;
   a support substrate; and
   an adhesive layer with which the piezoelectric substrate and the support substrate are bonded to each other,
   wherein the adhesive layer includes a flat portion and a swelling portion formed in an outer peripheral area of the flat portion, and
   the piezoelectric substrate includes a first surface that is bonded to the flat portion of the adhesive layer and a second surface at the side opposite to the front surface, and is bonded to the support substrate in an area excluding the swelling portion.

2. The composite substrate according to claim 1, wherein an outer peripheral edge of the first surface of the piezoelectric substrate is in contact with a boundary between the swelling portion and the flat portion of the adhesive layer.

3. The composite substrate according to claim 1, wherein the piezoelectric substrate has a bulging portion that is formed such that the first surface of the piezoelectric substrate is inside the second surface of the piezoelectric substrate when the first surface is projected in a perpendicular direction onto the second surface.

4. The composite substrate according to claim 3, wherein an angle between the first surface of the piezoelectric substrate and an outer peripheral surface of the piezoelectric substrate is obtuse.

5. A method for manufacturing a composite substrate, comprising:
   (a) a step of preparing a piezoelectric substrate;
   (b) a step of applying an adhesive to a support substrate by spin coating; and (c) a step of forming a composite substrate by bonding the support substrate and the piezoelectric substrate to each other with the adhesive, wherein the piezoelectric substrate prepared in step (a) includes a first surface and is shaped such that, in bonding in step (c), the first surface of the piezoelectric substrate is capable of being bonded to a flat portion of the adhesive layer and the piezoelectric substrate is capable of being bonded to the support substrate in an area excluding a swelling portion of the adhesive layer that is formed in an outer peripheral area of the flat portion, the flat portion and the swelling portion being formed when the adhesive is applied to the support substrate by spin coating in step (b), and in step (c), the bonding is performed so that the first surface is bonded to the flat surface of the adhesive layer and that the piezoelectric substrate is bonded to the support substrate in the area excluding the swelling portion of the adhesive layer.

* * * * *